United States Patent [19]
Grover et al.

[11] Patent Number: 5,511,031
[45] Date of Patent: Apr. 23, 1996

[54] SEMICONDUCTOR MEMORY SYSTEM HAVING SENSE AMPLIFIER BEING ACTIVATED LATE DURING CLOCK CYCLE

[75] Inventors: David B. Grover, South Hero; Edward F. O'Neil, III; Robert A. Ross, Jr., both of Essex Junction, all of Vt.

[73] Assignee: International Business Machines Corporation, Armonk, N.Y.

[21] Appl. No.: 298,649

[22] Filed: Aug. 31, 1994

[51] Int. Cl.⁶ .................................................. G11C 7/02
[52] U.S. Cl. .................... 365/208; 365/190; 365/205; 365/233; 365/194; 365/189.08; 365/207; 327/52; 327/57
[58] Field of Search .................... 365/190, 205, 365/233, 194, 189.08, 207, 208; 327/51, 52, 57

[56] References Cited

U.S. PATENT DOCUMENTS 4,339,809 7/1982 Stewart ................................. 365/206
4,435,793 3/1984 Oghii ................................... 365/233
5,058,062 10/1991 Wada et al. ........................ 365/185
5,327,394 7/1994 Green et al. ..................... 365/233.5

*Primary Examiner*—David C. Nelms
*Assistant Examiner*—Andrew Q. Tran
*Attorney, Agent, or Firm*—Robert A. Walsh

[57] ABSTRACT

A memory system is provided wherein array signals begin at the start of a first phase of a system clock and a sense amplifier set signal is developed during a second phase of the system clock which includes an array of memory cells including word lines and bit lines, word drivers connected to the word lines, a word address decoder enabled by the first phase of the clock system and coupled to the word drivers, a bit switch coupling a bit line to a sense amplifier, a system clock inverting circuit, a timing circuit having a first input connected to a late select signal, a second input connected to the inverting circuit and an output connected to the bit switch and a delay circuit having an input coupled to the inverting circuit and an output connected to the sense amplifier.

14 Claims, 4 Drawing Sheets

SEMICONDUCTOR MEMORY SYSTEM HAVING SENSE AMPLIFIER BEING ACTIVATED LATE DURING CLOCK CYCLE

TECHNICAL FIELD

This invention relates to delayed system clocked signal sensing for memory arrays, particularly to cache memory arrays.

BACKGROUND ART

Pipelined cache memory arrays used for microprocessors utilize self-resetting features for maximum performance. However, when multiple reads or writes need to be performed in a cycle, these features are found to be unacceptable. In high density cache memory arrays, accesses must be maintained within clock speeds. Current design of sensing schemes utilizes self-timed sensing from word or dummy word lines selections.

U.S. Pat. 5,058,062 by Y.Wada et al, which issued on Oct. 15, 1991, discloses a memory circuit wherein a bit line and a dummy bit line are connected to reset and set terminals of a sense amplifier circuit.

In U.S. Pat. No. 4,339,809 by R. G. Stewart, which issued on Jul. 13, 1982, there is disclosed a memory circuit wherein a transition detector receiving an input from memory addresses provides a pulse which passes through delay circuits to control the operation of sensing circuits.

Prior art small signal memory designs utilizing sensing schemes which are enabled by signals used to mimic or are patterned after the voltage and timing of word lines in memory arrays are indicated in a block diagram show in FIG. 1 of the drawings. FIG. 1 illustrates a sensing scheme wherein a dummy word line and dummy bit line pairs in a memory array are activated at the same time as the normally selected word and bit lines. These signals are then used to enable a sense latch along with late select signals which are generated by any appropriate known type of directory, such as from virtually or physically indexed caches. Referring to FIG. 1 in more detail, at the beginning of a clock cycle when the clock CLK is positive, array word addresses are applied to a word address decoder 10 which selects one of the word lines WL1 to WLn of memory cache array 12, driven by associated word drivers D1 to Dn, respectively, as well as selecting the dummy word line DWL driven by dummy word driver DD.

The array 12 includes a plurality of memory cells 14 and a plurality of pairs of bit lines BLT0,BLC1, BLT1,BLC1 through BLTn,BLCn and dummy bit line pair DBLT,DBLC arranged orthogonal to the word lines WL1 to WLn and DWL. The cells 14 are disposed at the intersections of the word lines and the pairs of bit lines. With the dummy word line DW1 and, e.g., word line WL1 selected, voltage differentials begin to develop on the dummy bit line pair DBLT,DBLC and on, e.g., bit line pair BLT0,BLC0. When the voltage differential is developing on the bit line pair BLT0,BLC0, a late select signal LSS0, derived from decoded bit line addresses, is applied to a timing circuit 16 to which is also applied an inverted clock ICLK generated from clock CLK through an inverter I, providing at the output of the timing circuit 16 a signal LS0. The signal LS0 is applied to a bit switch BS1 which turns on to couple the bit line pair BLT0,BLC0 to the input SAT and SAC of a differential sense amplifier SA.

Meanwhile, the signal being developed on the dummy bit line pairs DBLT,DBLC is applied to the input of a delay circuit 18 which supplies from its output set signal S to turn on the sense amplifier SA which senses the voltage differential developed across the bit line pair BLT0,BLC0. The delay circuit 18 is generally designed to apply the set signal S to the sense amplifier SA only after the signal on the pair of bit lines BLT0,BLC0 is large enough, as generally prescribed by process, environment and performance, to be sensed by the sense amplifier SA. It should be noted that had a cell 14 been selected which was to be developed on bit line pairs BLT1,BLC1, a late select signal LSS1 would have been applied to timing circuit 20, similar to that of timing circuit 16, to turn on the bit switch BS2. It can also be understood that the late select signals LSS0 and LSS1 are derived, as is known, from bit line addresses after they have been decoded.

It can be seen that in this prior art sensing technique the sense amplifier SA is always turned on at a fixed time after a word address is applied to the word address decoder 10 via the dummy circuits. Although this sensing technique has been used successfully, it is not satisfactory for some applications. For example, this prior art sensing technique can not be used satisfactorily in some applications since the late select signals arrive late in the cycle, thus, an incorrect read operation would occur. Accordingly, bit switches located after sense latches require a sense latch for each bit switch, decreasing array utilization.

DISCLOSURE OF THE INVENTION

It is an object of this invention to provide an improved signal sensing technique for memory arrays, particularly for cache memory arrays, wherein read or read modified write is employed or wherein multiple reads or writes are to be performed during one cycle, in which read operations using small signal sensing require delay tracking for latch operations.

In accordance with the teachings of this invention, a sensing system is provided which uses a late address signal to control bit switches and sense amplifiers, wherein the timing of the sense amplifier tracks well with the development of voltage offset at the sense amplifier nodes.

The foregoing and other objects, features and advantages of this invention will be apparent from the following more particular description of the preferred embodiments of the invention, as illustrated in the accompanying drawings.

BEST MODE FOR CARRYING OUT THE INVENTION

Figure 2:
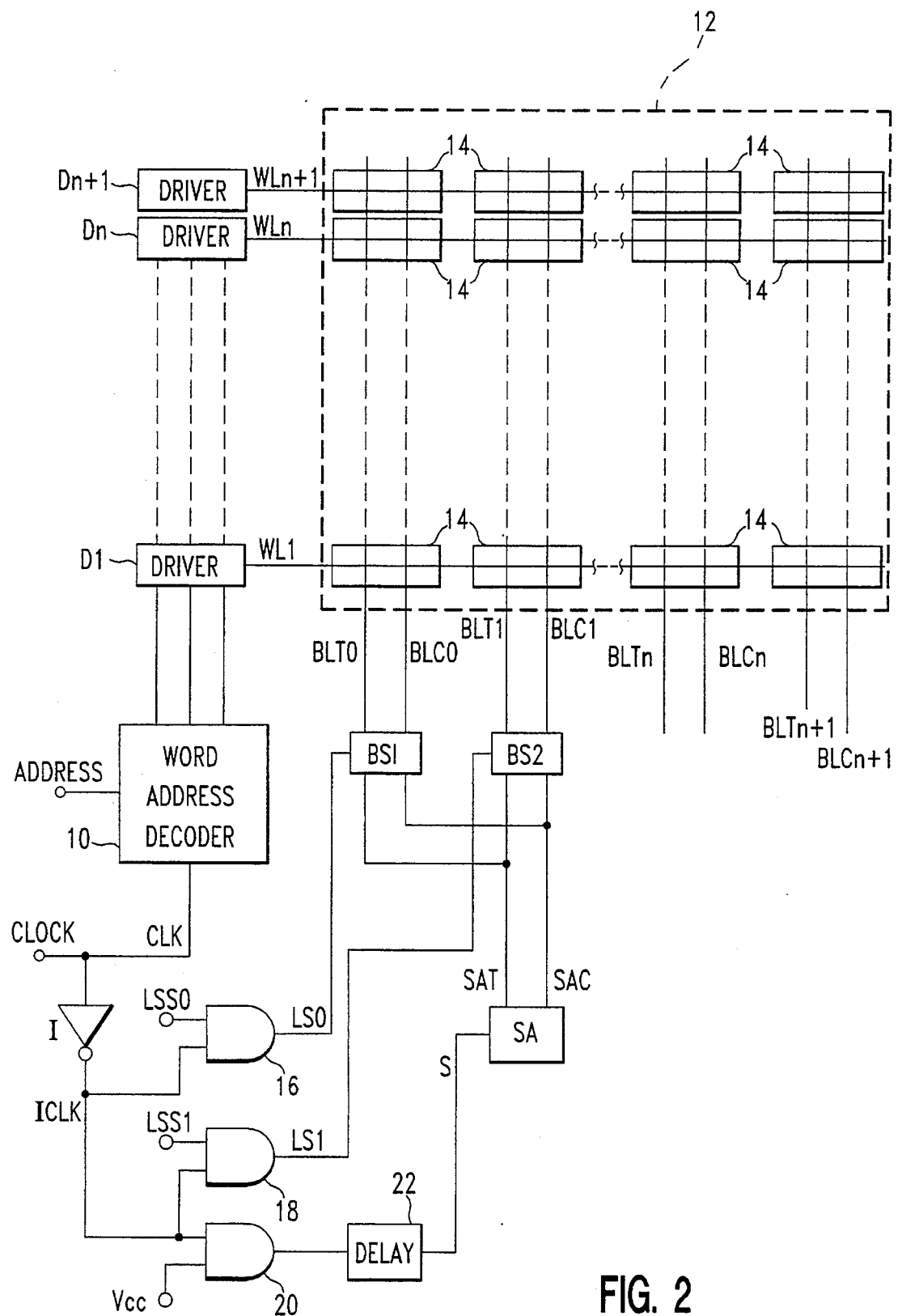
FIG. 2 is a block diagram illustrating the sensing technique in accordance with the teachings of the present invention.

Referring to FIG. 2 of the drawings in more detail, there is illustrated in a block diagram an embodiment of a memory system employing the sensing technique of the present invention which may be made on a semiconductor substrate or integrated circuit chip preferably in the complementary metal oxide semiconductor, CMOS, technology. The memory system of FIG. 2 of the drawings includes a word address decoder 10 having an address input and word line drivers D1 through Dn and Dn+1 coupled to the output of the word address decoder 10. An array 12 of memory cells 14 includes word lines WL1 through WLn and WLn+1 connected to the word drivers D1 through Dn and Dn+1, respectively. The array 12 also includes a plurality of pairs of bit lines BLT0,BLC0, BLT1,BLC1 through BLTn,BLCn and BLTn+1,BLCn+1 which are arranged orthogonal to the word lines WL1 through WLn and WLn+1 with the cells 14 disposed at the intersections of the word lines and the bit lines. A first bit switch BS1 is connected at one end to the pair of bit lines BLT0,BLC0 and at the other end to a sense amplifier SA. A second bit switch BS2 is connected at one end to the pair of bit lines BLT1,BLC1 and at the other end to the sense amplifier SA. Although not shown, the remaining pairs of bit lines are connected, as is known, to other bit switches and sense amplifiers.

A system clock CLK is applied to the word address decoder 10 and to an input of an inverter I, at the output of which is produced an inverted clock signal ICLK. The inverted clock signal ICLK is applied to one input of a first AND circuit 16, to one input of a second AND circuit 18 and to one input of a third AND circuit 20. A late select signal LSS0 is applied to a second input of the first AND circuit 16, a late select signal LSS1 is applied to the second input of the second AND circuit 18 and a constant voltage, preferably from a voltage supply source of 3.6 volts is applied to the second input of the third AND circuit 20. It should be noted that the late select signals LSS0 and LSS1 are derived in a known manner from bit line addresses that have been decoded, and it should be understood that the AND circuits 16, 18 and 20 may be replaced by any known timing circuits which can provide control of the timing of the output signals from the AND circuits 16, 18 and 20 relative to the inverted clock signal ICLK. An output signal LS0 from the output of the first AND circuit 16 is applied as a control signal to the first bit switch BS1 and an output signal LS1 from the output of the second AND circuit 18 is applied as a control signal to the second bit switch BS2. An output of the third AND circuit 20 is connected to an input of a delay circuit 22 which has its output connected as a control signal S to the sense amplifier SA.

Figure 3:
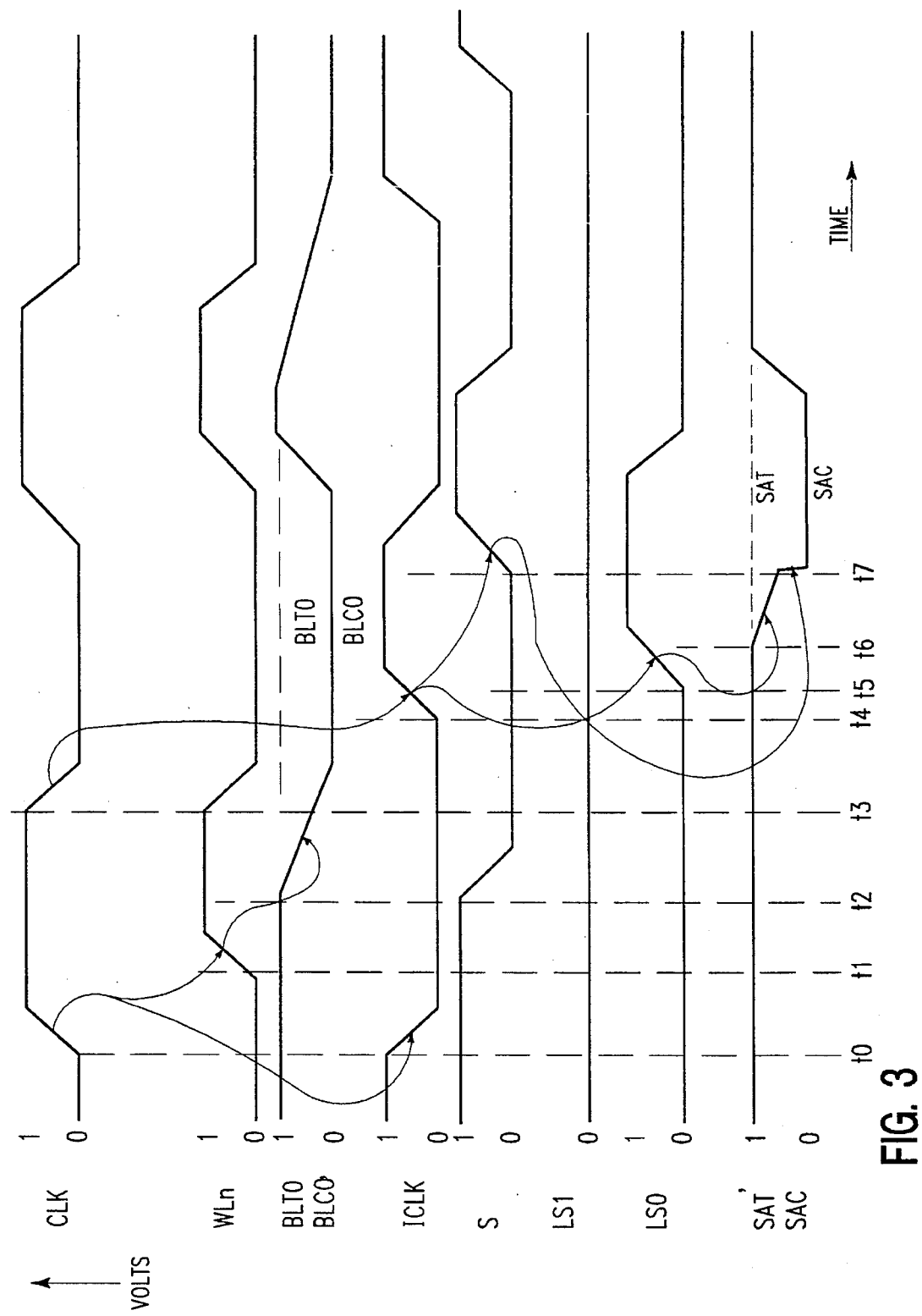
FIG. 3 is a timing diagram illustrating signals generated and utilized by the memory sensing technique of the present invention shown in FIG. 2 of the drawings.

In order to better understand the operation of the memory system of the present invention reference may be had to the timing diagram of FIG. 3 as well as to the block diagram of FIG. 2 of the drawings. As indicated in the timing diagram of FIG. 3, as the memory system clock CLK applied to the word address decoder 10, to which word addresses are also applied, goes positive, i.e., from logic 0 or 0 volts to logic 1 or 3.6 volts, at time t0, the decoder 10 selects the addressed word line, such as word line WLn, which rises to a logic 1 at time t1 with the positive voltage applied to the word line WLn, a cell 14, e.g., the cell at the intersection of word line WLn and bit line pair BLT0,BLC0, begins to discharge one of the bit lines of the bit line pair BLT0,BLC0 to a logic 0 at time t2. As is known, this voltage differential between the bit line pair BLT0,BLC0 continues to grow stronger with time.

Meanwhile, at time t3, system clock CLK begins to fall to a logic 0 which causes the inverted clock ICLK to go positive at time t4. At time t5 a late select signal LSS0 is applied to the first input of the first AND circuit 16. With the inverted clock ICLK now positive and late select signal LSS0 also positive, the output signal LS0 of the first AND circuit 16 is at a logic 1 which enables or activates the first bit switch BS1. With bit switch BS1 turned on, the voltage differential on bit line pair BLT0,BLC0 is transferred at time t6 to the inputs SAT and SAC of the sense amplifier SA. With the inverted clock ICLK also going high at time t4 at the first input of the third AND circuit 20, its output goes to a logic 1 since its second input is constantly maintained at a logic 1 by the voltage Vcc. The logic 1 developed at the output of the third AND circuit 20 is delayed by delay circuit 22 before it is applied to the sense amplifier SA as the set signal S at time t7, which causes the input SAC of the sense amplifier SA to abruptly discharge to zero volts, due to a logic 1 having been stored in the selected cell, as indicated at time t7 in the timing diagram of FIG. 3. The delay circuit 22 is designed so that the set signal S is applied to the sense amplifier SA after the positive signal LS0 is applied to the bit switch BS1, which generally allows the voltage differential across input SAT and SAC of the sense amplifier SA to attain a magnitude equal to the necessary voltage margin, accounting for noise, process and environmental sensitivities, suitable for reliable sensing by present day sense amplifiers.

It should be noted that since the late select signal LSS1 was not selected, the output at the second AND circuit 18 remains low, which maintains the second bit switch BS2 in an inactive status. If, at time t5, the late select signal LSS1 had arrived as a logic 1 instead of the late select signal LSS0 arriving as a logic 1, then bit switch BS2 would have been activated and the sense amplifier SA would have read the voltage offset between bit line pair BLT1,BLC1. Other bit line pairs of the memory array 12 are sensed in a similar manner. It should also be noted that after time t7, another similar cycle of the system clock CLK begins.

Figure 1:
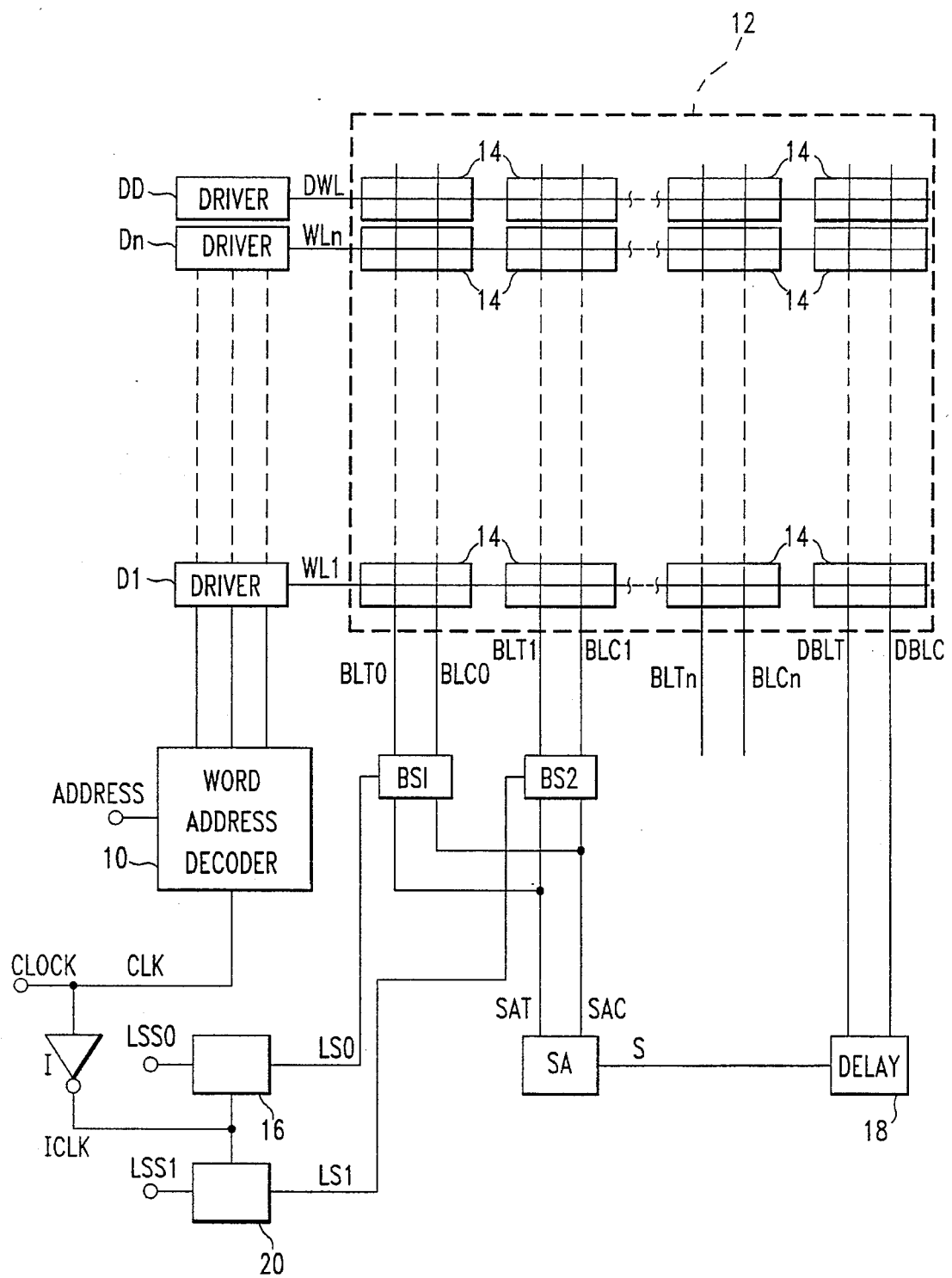
FIG. 1 is a block diagram of a prior art sensing technique.

Accordingly, it can be seen that this invention provides a memory system wherein the array signal is derived during a first phase of a cycle of the system clock, and the set pulse S for pulling down the sense amplifier SA is derived during and from a second phase of the cycle of the system clock. Thus, it can be seen that in the present invention, the time between the development of an array signal and the time for setting the sense amplifier SA will vary with different system clock frequencies or cycle times. Therefore, faster voltage offset is developed at the sense amplifier nodes due to a larger voltage differential on the bit line nodes prior to the bit switch opening for longer cycles or faster processes. It can also be seen that with the use of the sensing system of the present invention, memory systems or memory chips which do not develop sufficient voltage at the input of the sense amplifier to be reliably sensed at a particular clock frequency need not be discarded but can be used with systems having a longer clock cycle. This is a significant improvement over the sensing system used in the prior art system of FIG. 1 wherein the sense amplifier is always set at a fixed time after the word address decoder activates the dummy word line regardless of the system clock frequency. It should be noted that process tracking is superior due to the fact that the sense signal is controlled solely by device process whereas in the prior art system of FIG. 1 sense signal control is variable with device process, wire resistance and capacitance of dummy word lines and bit lines. It should also be noted that the system of the present invention eliminates the need for the use of array cells for dummy word lines and dummy bit lines, thus, more cells on a given memory array or semiconductor chip are available for storing binary logic data.

Figure 4:
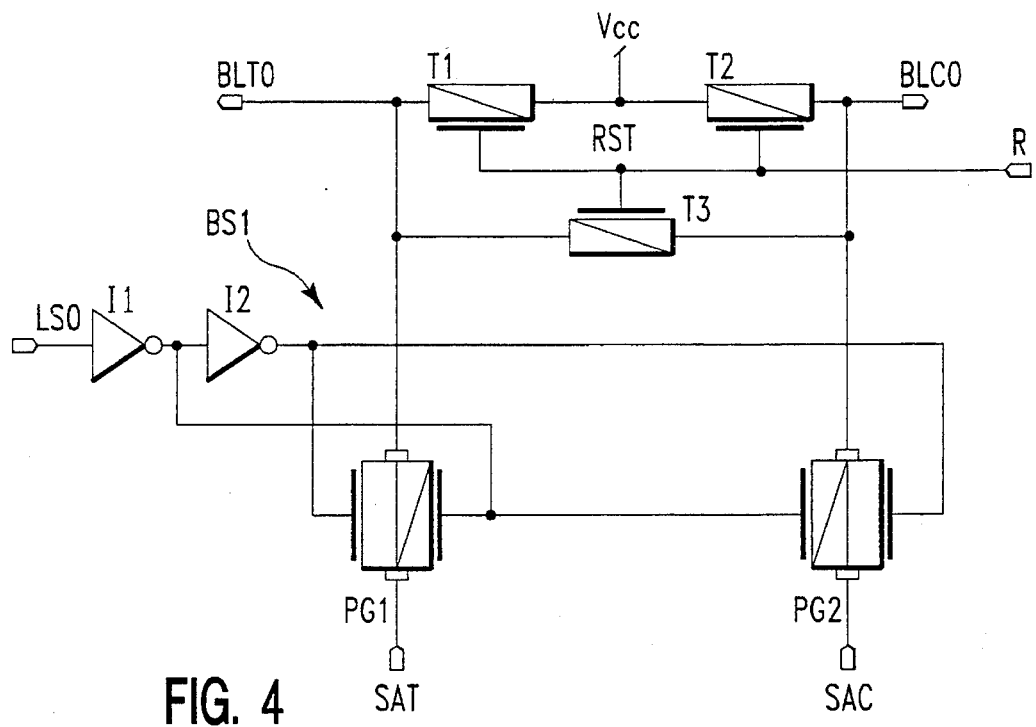
FIG. 4 is a circuit diagram illustrating the details of a bit switch which may be used in a memory system utilizing the sensing technique of the present invention.

The bit switches BS1 and BS2 may be of any known circuitry, with a preferred circuit being illustrated in FIG. 4 of the drawings. As can be seen by referring to FIG. 4, the sense amplifier inputs SAT and SAC are connected to one end of passgates PG1 and PG2, respectively. Each of the passgates PG1 and PG2 includes, as is known, N-channel and P-channel field effect transistors connected in parallel. The other end of the passgates PG1 and PG2 are connected to the bit lines BLT0 and BLC0, respectively. The passgates PG1 and PS2 are turned on by applying the positive signal of LS0 from the output of the first AND circuit 16 to an input of the first of two serially connected inverters I1 and I2 which have their outputs connected to the passgates PG1 and PG2. As is known, each of the bit lines BLT0 and BLC0 is restored to a logic 1 by applying a logic 0 to terminal R of a restore circuit RST having P-channel field effect transistors T1, T2 and T3 prior to each read operation.

Figure 5:
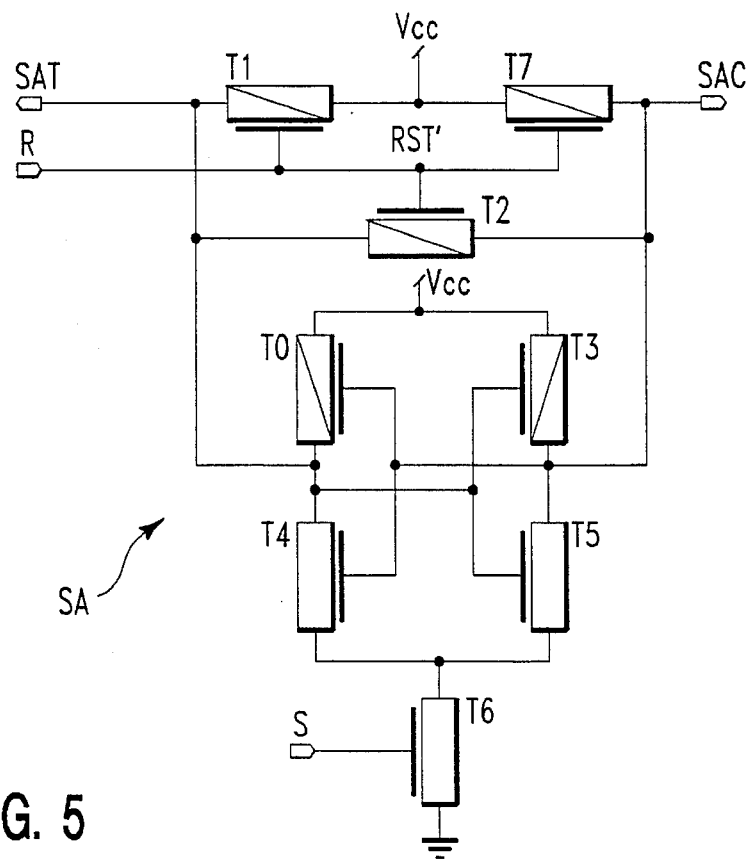
FIG. 5 is a circuit diagram illustrating the details of a sense amplifier which may be used in a memory system utilizing the sensing technique of the present invention.

The sense amplifier SA may be of any known circuitry, with a preferred circuit being illustrated in FIG. 5 of the drawings. As can be seen by referring to FIG. 5, the sense amplifier SA includes P-channel field effect transistors T0 and T3 and N-channel field effect transistors T4 and T5 arranged in the form of a latch having inputs SAT and SAC. A pull-down transistor T6 has the set pulse S from the output of the delay circuit 22 applied to its gate electrode. As is known, each of the inputs SAT and SAC is restored to a logic 1 by applying a logic 0 to terminal R of a restore circuit RST' having P-channel field effect transistors T1, T2 and T7 prior to each read operation.

While the invention has been particularly shown and described with reference to preferred embodiments thereof, it will be understood by those skilled in the art that various changes in form and detail may be made therein without departing from the spirit and scope of the invention.

What is claimed is:

1. A memory system comprising an array having a plurality of memory cells, each of said memory cells having a cell voltage signal having one of a plurality of predetermined voltage magnitudes stored therein, a sense amplifier, a system clock having a voltage with a first phase of a given voltage magnitude and a subsequent second phase of a voltage magnitude significantly different from the given voltage magnitude, means responsive to the first phase of the voltage of said system clock for applying the cell voltage signal from a selected one of said memory cells to an input of said sense amplifier, and means responsive to the second phase of the voltage of said system clock and to a given voltage signal of a given voltage magnitude having its onset delayed with respect to the onset of the second phase of the voltage of said system clock for enabling said sense amplifier at a time subsequent to the arrival of the cell voltage signal at the input of said sense amplifier.

2. A memory system comprising an array having a plurality of memory cells, each of said memory cells having a cell voltage signal having one of a plurality of predetermined voltage magnitudes stored therein, a sense amplifier having an input, a bit switch having an input and an output disposed between said array and the input of said sense amplifier, a system clock having a voltage with a first phase of a given voltage magnitude and a second phase of a voltage magnitude significantly different from the given voltage magnitude, first means responsive to the first phase of the voltage of said system clock for applying the cell voltage signal from a selected one of said memory cells to the input of said bit switch, and second means including a timing circuit responsive to the second phase of the voltage of said system clock and to a late select signal for activating said bit switch at a time subsequent to the arrival of the cell voltage signal at the input of said bit switch and including a delay circuit responsive to the second phase of the voltage of said system clock for enabling said sense amplifier at a time subsequent to the arrival of the late select signal.

3. A memory system as set forth in claim 2 wherein said first means includes a word address decoder and said second means includes an inverting circuit connected to said timing circuit and to said delay circuit.

4. A memory system as set forth in claim 3 wherein said delay circuit of said second means includes an input coupled to an output of said inverting circuit and an output connected to said sense amplifier.

5. A memory system as set forth in claim 4 wherein said sense amplifier includes a latch and a pull-down transistor serially connected with said latch, the out of said delay circuit being connected to a control electrode of said pull-down transistor.

6. A memory system comprising an array having a plurality of word lines, a plurality of pairs of bit lines arranged orthogonal to said plurality of word lines and a plurality of memory cells disposed at the intersections of said plurality of word lines and said plurality of pairs of bit lines, each of said memory cells having a voltage signal of one of a plurality of predetermined voltage magnitudes stored therein, a differential sense amplifier having first and second inputs, a system clock having a voltage with a first phase of a given voltage magnitude and a subsequent second phase of a voltage magnitude significantly different from the given voltage magnitude, first means responsive to the first phase of the voltage of said system clock for applying the voltage signals from first and second memory cells of said plurality of memory cells to first and second pairs of bit lines of said plurality of pairs of bit lines, first and second bit switches, each having first and second inputs and first and second outputs connected to the first and second inputs, respectively, of said differential sense amplifier, the first and second inputs of said first bit switch being coupled to said first pair of bit lines and the first and second inputs of said second bit switch being coupled to said second pair of bit lines, and second means responsive to said second phase of the voltage of said system clock for activating said differential sense amplifier at a given instant of time, said second means including a timing circuit responsive to said second phase of the voltage of said system clock and to a given voltage signal delayed with respect to the onset of said second phase of the voltage of said system clock for activating one of said first and second bit switches at an instant of time prior to said given instant of time.

7. A memory system comprising an array having a plurality of memory cells, each of said memory cells having a voltage signal having one of a plurality of predetermined voltages stored therein, a sense amplifier, a system clock having a voltage with a first phase of a given voltage magnitude and a second phase of a voltage magnitude significantly different from the given voltage magnitude, first means including a word address decoder responsive to the first phase of the voltage of said system clock for applying the voltage signal from a selected one of said memory cells to an input of said sense amplifier, and second means including an inverting circuit and a bit switch responsive to the second phase of the voltage of said system clock for enabling said sense amplifier at a time subsequent to the arrival of the voltage signal at the input of said sense amplifier, said inverting circuit being serially connected with a delay means and said bit switch being disposed between said array and said sense amplifier, said second means further including a timing circuit having a first input connected to an output of said inverting circuit and a second input connected to a late select signal and an output connected to said bit switch.

8. A memory system as set forth in claim 7 wherein said timing circuit is an AND circuit.

9. A memory system as set forth in claim 7 wherein said bit switch includes passgates and a first inverter connected serially with a second inverter with the output of said timing circuit connected to said passgates through said first and second inverters.

10. A memory system comprising an array having a plurality of memory cells, each of said memory cells having a voltage signal having one of a plurality of predetermined voltage magnitudes stored therein, and further including a plurality of word lines and a plurality of bit lines orthogonally arranged with respect to said plurality of word lines, a sense amplifier having an input, a system clock having a voltage with a first phase of a given voltage magnitude and a second phase of a voltage magnitude significantly different from the given voltage magnitude, means including a word address decoder and a plurality of word drivers responsive to the first phase of the voltage of said system clock for applying the voltage signal from a selected one of said memory cells to the input of said sense amplifier, said plurality of word drivers having inputs coupled to said word address decoder and outputs connected to the word lines of said array, and means including a bit switch, an inverter, timing means and delay means responsive to the second phase of the voltage of said system clock for enabling said sense amplifier at a time subsequent to the arrival of the voltage signal of predetermined magnitude corresponding to the voltage signal at the input of said sense amplifier, said bit switch being disposed between one of said plurality of bit lines and said sense amplifier, said inverter having an output, said timing means having a late select signal applied to a first input thereof and an output connected to said bit switch and said delay means having an output connected to said sense amplifier, the output of said inverter being coupled to a second input of said timing means and to an input of said delay means.

11. A memory system as set forth in claim 10 wherein said delay means includes a delay circuit having an input an output, said first AND circuit having a first input and an output, said first input of said first AND circuit being connected to the output of said inverter and the output of said first AND circuit being connected to the input of said delay circuit, a second input of said first AND circuit being connected to a reference potential and the output of said delay circuit being connected to said sense amplifier, and said timing means being a second AND circuit.

12. A memory system as set forth in claim 10 wherein said plurality of bit lines includes a plurality of pairs of bit lines and said sense amplifier is a differential sense amplifier.

13. A memory system comprising an array having a plurality of word lines, a plurality of pairs of bit lines arranged orthogonal to said plurality of word lines and a plurality of memory cells disposed at the intersections of said plurality of word lines and said plurality of pairs of bit lines, each of said memory cells having a voltage signal of one of a plurality of predetermined voltage magnitudes stored therein, a differential sense amplifier having first and second inputs, a system clock having a voltage with a first phase of a given voltage magnitude and a second phase of a voltage magnitude significantly different from the given voltage magnitude, means responsive to the first phase of the voltage of said system clock for applying the voltage signals from first and second memory cells of said plurality of memory cells to first and second pairs of bit lines of said plurality of pairs of bit lines, first and second bit switches, each having first and second inputs and first and second outputs connected to the first and second inputs, respectively, of said differential sense amplifier, the first and second inputs of said first bit switch being coupled to said first pair of bit lines and the first and second inputs of said second bit switch being coupled to said second pair of bit lines, and means including an inverter, first timing means, second timing means and delay means responsive to said second phase of the voltage of said system clock for activating one of said first and second bit switches at a first instant of time and for activating said differential sense amplifier at a second instant of time subsequent to said first instant of time, said inverter having an input coupled to said system clock and an output, said first timing means having a first late select signal applied to a first input thereof, a second input thereof being coupled to the output of said inverter and an output thereof being coupled to said first bit switch, said second timing means having a second late select signal applied to a first input thereof, a second input thereof being coupled to the output of said inverter and an output thereof being coupled to said second bit switch, and said delay means having an input coupled to the output of said inverter and an output coupled to said sense amplifier.

14. A memory system as set forth in claim 13 wherein said first timing means includes a first AND circuit, said second timing means includes a second AND circuit and said delay means includes a third AND circuit having a first input coupled to the output of said inverter and a delay circuit having an input coupled to an output of said third AND circuit and an output coupled to said differential sense amplifier, a second input of said third AND circuit being connected to a constant high voltage.

* * * * *